United States Patent [19]

Seddon

[11] 4,276,855
[45] Jul. 7, 1981

[54] COATING APPARATUS

[75] Inventor: Richard I. Seddon, Santa Rosa, Calif.

[73] Assignee: Optical Coating Laboratory, Inc., Santa Rosa, Calif.

[21] Appl. No.: 35,396

[22] Filed: May 2, 1979

[51] Int. Cl.³ .............................................. C23C 13/08
[52] U.S. Cl. ..................................... 118/719; 118/730
[58] Field of Search .......................... 427/251, 248 G; 118/729, 730, 719, 731, 500; 204/298

[56] References Cited

U.S. PATENT DOCUMENTS

| 3,643,625 | 2/1972 | Mahl | 118/730 X |
|---|---|---|---|
| 3,858,547 | 1/1975 | Bergfelt | 118/730 |

FOREIGN PATENT DOCUMENTS 2810811  9/1978  Fed. Rep. of Germany ........... 118/730

OTHER PUBLICATIONS

"Contamination Free Sputtering," Buchmann et al., IBM Technical Disclosure Bulletin, vol. 15, No. 6, Nov. 1972, pp. 1818-1819.

Primary Examiner—John P. McIntosh
Attorney, Agent, or Firm—Flehr, Hohbach, Test, Albritton & Herbert

[57] ABSTRACT

A coating apparatus having a housing and a vacuum pump for establishing a vacuum in the housing. First and second rotors are disposed within the housing for rotation about axes which are offset from the horizontal by less than 45° whereby the upper portions of the rotors are in relatively close proximity to each other and the lower portions of the rotors are spaced apart from each other. A source of coating material is disposed between the rotors generally in line with the axis of rotation of the rotors. The rotors have substrate carrying surfaces having longitudinal dimensions extending generally parallel to the axis of rotation which is such so that an imaginary vertical line extending downwardly from the top portion of the substrate carrying surface from the inner extremity of the same clears the outermost margin of the lower portion of the substrate carrying surfaces of the rotor whereby debris and the like falling by force of gravity from the top portion of the rotor will clear the lower portion of the rotor.

10 Claims, 2 Drawing Figures

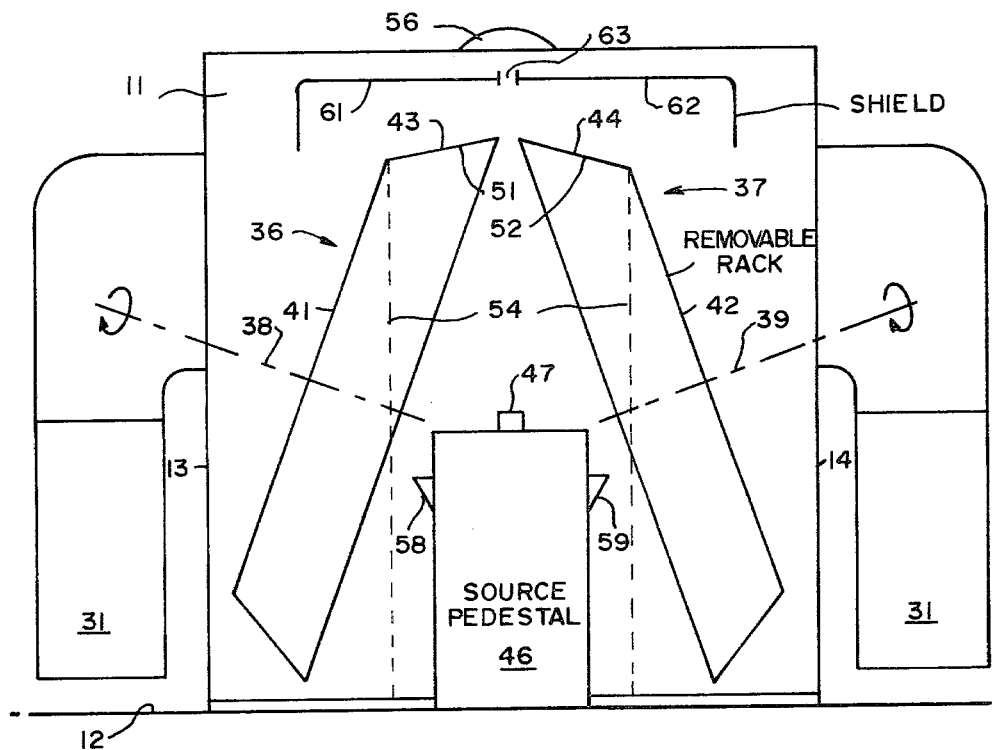
FIG.—1
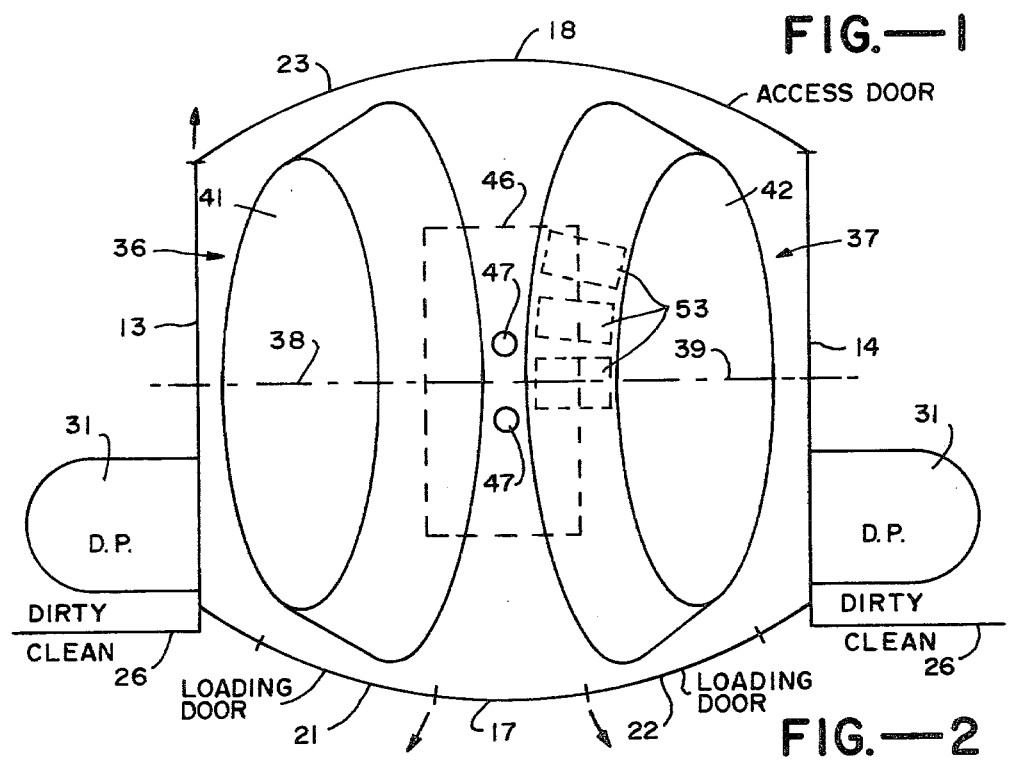
FIG.—2

COATING APPARATUS

Coating machines have heretofore been devised for coating large substrates in high volume by a batch method. By way of example, such coaters have been provided with large squirrel cage type rotation systems which are utilized for holding the substrates for rotation about a horizontal axis with the substrates being supported within the squirrel cage. The source for the vapors used for coatings is provided from a thimble disposed within the squirrel cage. In addition, disposed within the squirrel cage is all of the equipment which is required for making the coatings. It has been found that with such apparatus it is difficult to obtain coatings which are pin hole free because of the tendency of material to flake off from within the squirrel cage and from other parts involved down in the inside surfaces of the squirrel cage and onto the surfaces of the substrates which are being coated. In addition, with such coaters it has been difficult to mate the same for use with clean rooms. There is, therefore, need for a new and improved coating apparatus and method which overcomes these difficulties.

In general, it is an object of the present invention to provide a coating apparatus and method which minimizes the dirt and other contaminants which can fall on the substrates while being coated.

Another object of the invention is to provide an apparatus and method of the above character which has high volume capabilities.

Another object of the invention is to provide an apparatus and method of the above character in which relatively good uniformity in the coating of the substrates is obtained.

Another object of the invention is to provide a coating apparatus and method in which the shape, location, and axis of rotation of the rotors on which the substrates are mounted complement the cosine distribution of the vapor stream to ensure relatively uniform coating thickness.

Another object of the invention is to provide a coating apparatus and method of the above character in which coatings can be applied with very few defects.

Another object of the invention is to provide a coating apparatus and method which makes it possible to readily operate the apparatus in conjunction with a clean room environment.

Another object of the invention is to provide an apparatus of the above character in which two rotors can be provided.

Additional objects and features of the invention will appear from the following description in which the preferred embodiments are set forth in conjunction with the accompanying drawings.

FIG. 1 is a side elevational view in schematic form of a coating apparatus incorporating the present invention.

FIG. 2 is a top plan view of the coating apparatus shown in FIG. 1.

The coating apparatus cconsists of a housing with means for establishing a vacuum in the housing. A source of coating material is mounted within the housing for providing a vapor stream having an approximate cosine distribution. At least one rotor is mounted within the housing for rotation about an axis which is offset from the horizontal by less than 45°. The rotor is provided with generally circular means for supporting substrates to be coated so that coating material from the circular means and substrates at an upper portion of the circular means cannot fall onto substrates carried by a lower portion of the circular means. For this purpose, the circular means has a dimension longitudinal of the axis of rotation which is such so that an imaginary line extending vertically from the innermost extremity of the circular means at the top portion thereof clears the outermost extremity of the portion of the circular means at the bottom portion thereof. In this way debris and other material falling by force of gravity from the top portion of the circular means will clear the bottom portion of the circular means.

A coating machine or apparatus incorporating the present invention is shown in FIGS. 1 and 2. As shown therein, the coating apparatus consists of a housing 11 which has a generally rectangular dimension in fron elevation as shown in FIG. 1 and a generally barrel-shaped configuration which is shown in FIG. 2. As shown, the housing 11 is adapted to rest upon a floor 12 and is provided with a pair of spaced generally parallel vertical end walls 13 and 14, a generally horizontal top wall 16 and front and rear walls 17 and 18. As shown in FIG. 2, the front wall 17 can be provided with a pair of loading doors 21 and 22 which are relatively small in size whereas the rear wall 18 can be provided with a large access door 23 to facilitate cleaning of the apparatus.

The apparatus is constructed in such a manner so that it can be readily mated with clean room facilities. Thus, by way of example, as shown in FIG. 2, the apparatus may be mounted in such a manner so that the loading doors 21 and 22 open into a clean room as represented by the line 26 and where the remainder of the apparatus is disposed in a dirty environment.

Means is provided for supplying a vacuum to the interior of the housing and can consist of one or more diffusion pumps 31 which are connected to the housing to provide the desired vacuum within the housing.

At least one and preferably a pair of rotors 36 and 37 are mounted within the housing 11. Means (not shown) is provided for rotating the rotors 36 and 37 about axes 38 and 39 which are offset from the horizontal by an angle which is less than 45°. As shown, the rotors 36 and 37 are in the form of truncated cones and support structures 41 and 42 which are mounted upon the associated shafts. The support structures 41 and 42 are represented in the form of flat circular plates which carry racks or rack-like structures 43 and 44. The racks 43 and 44 as shown are generally conical but, if desired, can be generally cylindrical to provide generally circular means which are rotated about the axes 38 and 39.

It will be noted that the rotors 43 and 44 are mounted in such a manner so that their upper portions are tipped toward each other whereas the lower portions are tilted away from each other. This has several advantages as hereinafter described. As shown in FIGS. 1 and 2, it permits the mounting of a source pedestal 46 within the housing between the lower extremities of the two rotors 36 and 37. At least one and preferably two or more coating sources 47 are carried by the pedestal and, as shown in FIG. 2, are provided on opposite sides of the center line of the chamber. The sources 47 can be of a conventional type as, for example, electron gun type sources each of which provides a vapor stream which has approximately a cosine distribution. The generally rack-like structures 43 and 44 extend outwardly at an angle to a line normal to the support structures 41 and 42 so that the inner surfaces of the same generally approximate the cosine distribution intensity of the vapor stream from the source or sources 47 carried by the pedestal 46. In this way it is possible to obtain a uniformity distribution within approximately 10% without the use of auxiliary masks to modify the vapor stream distribution. Such masks are undesirable in the manufacture of defect free coatings since coating material which builds up on the masks may flake off and contaminate the substrates.

The interior surfaces 51 and 52 of the racks 43 and 44 can be utilized for supporting articles or substrates 53, one surface of which is to be coated from the materials evaporated from the sources 47. The surfaces 51 and 52 have a length perpendicular to the support structures 41 and 42 and parallel respectively to the axes 38 and 39 which is such that an imaginary vertical line represented by the broken line 54 extending vertically from the topmost portion of the rack 43 readily clears the bottom portion of the rack as shown particularly in FIG. 1 with the rack inclined to the amount shown for the purpose hereinafter described.

In addition, there should be sufficient space provided between the top extremities or portions of the rotors 36 and 37 so some vapor can escape therethrough and be monitored by the optical monitoring apparatus 56 carried by the top of the housing 11.

It should be appreciated that the source pedestal 46 is also an appropriate place to mount glow discharge devices which are frequently used for cleaning of the surface to be coated. Also, if heating is required, heaters can also be mounted on the source pedestal 46. The glow discharge system and the heaters should be mounted in such a manner that they would face downwardly so they will not collect dirt or other debris during operation of the apparatus. These glow discharge devices and heaters are represented schematically at 58 and 59 on the source pedestal.

In order to facilitate cleaning out the interior of the housing 11, shields 61 and 62 can be provided in the housing above the rotors 36 and 37. As will be noted, the shields 61 and 62 are spaced apart so that there is provided a central opening 63 to make it possible for the optical monitoring apparatus 56 to monitor the vapor streams from the sources 47. The dimensions of the racks 43 and 44 are primarily determined by the size of substrates which it is desired to coat. By way of example, a coating apparatus incorporating the present invention could be provided with a housing having an overall height of approximately 9 feet with the rotors having a diameter of 9 feet and with the racks 43 and 44 being capable of carrying substrates up to approximately 20 inches square.

Operation of the coating apparatus in performing the method may now be briefly described as follows: Let it be assumed that it is desired to operate the apparatus in a clean room environment as shown. When such is the case, the loading doors 21 and 22 are opened and the racks are loaded with the substrates which are to be coated. The coating sources 47 are supplied with material after which the loading doors 21 and 22 are closed. The rotors 43 and 44 are then rotated about the axes 38 and 39. If desired, glow discharge cleaning and heating steps hereinbefore described can be performed. Thereafter, the sources 47 are placed in operation to cause vapor streams to be formed which will move upwardly in a cosine distribution toward the upper portions of the racks 43 and 44 and to impinge upon the inner sufaces of the substrates 53 carried by the racks and facing the sources 47. In this way, the exposed surfaces of the substrates can be coated wth one or more coatings in a manner well known to those skilled in the art. After the coating operation has been completed, the loading doors 21 and 22 can be opened and the coated substrates unloaded from the rotors 36 and 37. Thereafter, the same procedure can be repeated. The construction of the coating apparatus is such that after numerous coating operations have been carried out, access to the same can be obtained through the large access door 18 in the dirty environment.

It should be noted that the source pedestal 46 is formed so that the sources 47 are mounted at a height which is approximately at the axes of rotation for the rotors 36 and 37 to obtain the most optimum utilization of the coating material. If the electron guns are positioned substantially above the center line, it is difficult to obtain good uniformity. If they are positioned substantially below the center lines, then there is a greater waste of the coating material.

With the construction which is shown, it can be seen that in the event any material falls off the inner surfaces 51 and 52 or off of the substrates carried thereby from the upper portions of the rotors 36 and 37 that the same will drop downwardly and will clear the lower extremities of the rotor and thus will not fall upon the substrates carried by the lower portions of the rotors 36 and 37. This ensures that the surfaces to be coated will remain relatively clean at all times and facilitates the making of coatings which are substantially pin hole free. Thus, it can be seen that tilting of the rotors in the manner hereinbefore described ensures that dirt and other debris falling from the upper portions of the rotors will not fall by force of gravity upon the surfaces of the substrates below. Rather, any material which falls will fall downwardly clear of the rotors onto the bottom of the housing 11.

It is apparent from the foregoing that there has been provided a coating apparatus and method which makes it possible to coat large quantities of substrates relatively rapidly without danger of debris or other material falling upon the substrates. This is accomplished by tilting of the rotors so that the upper extremities are brought together and the lower extremities are pulled apart so that debris and the like falling from the upper extremities will not fall onto the substrates carried on the lower extremities.

What is claimed is:

1. In a coating apparatus, a housing, means for establishing a vacuum in the housing, a source of coating material mounted in the housing for providing a vapor stream having approximately a cosine distribution, at least one rotor mounted in the housing for rotation about an axis which is offset from the horizontal by less than 45°, said rotor extending above and below the source and having a generally circular rack, said rack having interior substrates carrying surfaces facing the axis of rotation and overlying the vapor sources at least part of the time that the rotor is rotated, said rack having a dimension parallel to the axis of rotation which is such so that an imaginary line extending vertically from the innermost extremity of the rack at the top portion thereof clears the outer extremity of the bottom portion of the rack whereby debris falling downwardly by force of gravity from the top portion of the rack will clear the lower portion of the rack.

2. Apparatus as in claim 1 together with an additional rotor of substantially the same size and shape as the first named rotor mounted in said housing and in which the additional rotor is also offset from the horizontal by an angle of less than 45° but in an opposite direction so that the upper extremities of the rotors are in relatively close proximity to each other and the lower extremities of the rotors are spaced apart a substantial distance.

3. Apparatus as in claim 2 together with the source disposed between the rotors.

4. Apparatus as in claim 2 wherein said rotors are in the form of truncated cones.

5. Apparatus as in claim 4 wherein the source is disposed between the two rotors.

6. Apparatus as in claim 5 wherein the source is disposed at a level which is generally in line with the axis of rotation for the rotors.

7. Apparatus as in claim 1 for use in a clean room and in which one portion thereof is mated to the clean room and the other portion thereof is exterior of the clean room.

8. Apparatus as in claim 7 wherein said housing is provided with openings together with doors closing said openings, said openings opening into said clean room.

9. In a coating apparatus, a housing, means for establishing a vacuum in the housing, first and second rotors disposed in the housing for rotation about axes which are offset from the horizontal by less than 45° whereby the upper portions of the rotors are in relatively close proximity to each other and the lower portions of the same are relatively remote from each other, a source of coating material disposed between the rotors generally in line with the axes of rotation of the rotors, portions of said rotors extending above and below said source, said rotors having interior substrate carrying surface facing the axes of rotation and overlying the vapor source at least part of the time during rotation of the rotors, said substratae carrying surface of each rotor having a longitudinal dimension so that an imaginary vertical line extending downwardly from the top portion thereof from the inner extremity of the same clears the outermost margin of the bottom portion of the substrate carrying surfaces whereby debris and the like falling by force of gravity from the top portion of the said rotor will clear the lower portion of said rotor.

10. Apparatus as in claim 9 wherein said rotors are in the form of truncated cones.

* * * * *